US007018774B2

(12) United States Patent
Aoai et al.

(10) Patent No.: US 7,018,774 B2
(45) Date of Patent: Mar. 28, 2006

(54) INFRARED SENSITIVE COMPOSITION AND LITHOGRAPHIC PRINTING PLATE PRECURSOR

(75) Inventors: Toshiaki Aoai, Shizuoka (JP); Akihiro Endo, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 99 days.

(21) Appl. No.: 10/673,450

(22) Filed: Sep. 30, 2003

(65) Prior Publication Data

US 2004/0063029 A1 Apr. 1, 2004

(30) Foreign Application Priority Data

Sep. 30, 2002 (JP) ............................. 2002-285697

(51) Int. Cl.
*G03F 7/038* (2006.01)
*G03F 7/14* (2006.01)

(52) U.S. Cl. .................. 430/270.1; 430/292; 430/302; 430/964

(58) Field of Classification Search ............. 430/270.1, 430/302, 292, 964
See application file for complete search history.

(56) References Cited

U.S. PATENT DOCUMENTS 6,143,471 A * 11/2000 Takata et al. ............ 430/281.1

FOREIGN PATENT DOCUMENTS

| | | | |
|---|---|---|---|
| EP | 0 897 134 | A2 | 2/1999 |
| EP | 1 236 569 | A2 | 9/2002 |
| JP | 11-143076 | A | 5/1999 |
| JP | 11-190903 | A | 7/1999 |

OTHER PUBLICATIONS

European Search Report dated Jan. 15, 2004.

* cited by examiner

*Primary Examiner*—Richard L. Schilling
(74) *Attorney, Agent, or Firm*—Sughrue Mion, PLLC

(57) ABSTRACT

An infrared sensitive composition and a lithographic printing plate precursor having a large difference in alkali solubility between the exposed portions and unexposed portions (dissolution discrimination), an excellent latitude in development, and a high sensitivity can be provided when the composition is used for the image-forming layer of a lithographic printing plate precursor, which is an infrared sensitive composition comprising an alkali-soluble resin having a phenolic hydroxyl group (A), a light-heat converting substance (B) and a leucohydroxy dye (C).

8 Claims, No Drawings

INFRARED SENSITIVE COMPOSITION AND LITHOGRAPHIC PRINTING PLATE PRECURSOR

FIELD OF THE INVENTION

The present invention relates to an infrared sensitive composition and a lithographic printing plate precursor, and specifically to an infrared sensitive composition usable for the image-forming layer of a positive type lithographic printing plate precursor for the so-called direct platemaking that can be directly achieved with the aid of digital signals from computers and the like.

BACKGRAOUND OF THE INVENTION

Known systems of the direct platemaking carried out by use of the digital date from computers include (1) a system according to electrophotographic technology, (2) photo-induced polymerization materials based on a combination of exposure with a visible ray or ultraviolet ray laser of 532 nm, 488 nm, 405 nm, or the like and post-heating, (3) silver salt-sensitive materials laminated to photosensitive resins, (4) a system of silver master type, and (5) a system based upon the breakdown of a silicone rubber layer through discharge breakdown or by laser rays.

However, the system according to the electrophotographic technology (1) needs complicated treatments such as electrification, exposure, and development and an intricate and large-scale apparatus. The system (2) needs the post-heating treatment and, moreover, a highly sensitive forme material which makes difficult handling in an illuminated room. The systems (3) and (4) suffer from the defect that use of the silver salts makes treatments difficult, causing costs to increase. And the system (5) encounters a problem of removing silicone dregs left on the surface of the forme, although it is a method of a comparatively high degree of perfection.

On the other hand, the development of lasers is remarkable in recent years, and particularly high output and small-sized solid lasers and semiconductor lasers emitting rays in the near infrared and infrared regions come to be readily available. These lasers are very useful as exposure sources for the direct platemaking carried out by use of the digital data of computers in view of miniaturization of platemaking systems, environmental light in platemaking operation, and costs of forme materials.

As a conventional lithographic printing plate material, JP-B-46-27919 describes a method for image formation in which a recording material containing a recording layer mixed with a polymer compound or a composition that is insoluble or slightly soluble before heating can become soluble in a solvent under the influence of heat is heated according to information to form an image. Furthermore, JP-A-56-69192 discloses a heat-sensitive recording material having a heat-sensitive layer which contains a novolak-type phenolic resin and carbon black. However, these patent literatures only discloses examples in which images are recorded without using laser rays, and when the images are recorded with lasers emitting rays in the near infrared and infrared regions as the exposure sources for the direct platemaking carried out by use of the digital data of computers, good printed matter cannot necessarily be obtained because of scumming and deterioration in printing impression. In order to obtain good printed matter, it is necessary that in a treatment with an alkaline developer after exposure, portions having undergone irradiation with light (non-image areas) are easily dissolved and portions having undergone no irradiation with light (image areas) remain and, moreover, this remaining image areas have good durability. That is, in these known techniques, it is thought that use of the laser rays fails to bring about good image-recording properties, that is, the non-image areas tend to dissolve with difficulty and the image areas tend to dissolve with ease.

In order to solve these problems of the aforesaid known techniques, JP-A-7-285275 discloses that a system in which the direct platemaking is carried out by use of the digital data of computers and having good recording properties in spite of use of conventional treating apparatuses and printing apparatuses can be provided by use of an image recording material containing in the image-forming layer thereof a binding agent, a substance absorbing light and emitting heat, and a substance that is thermally decomposable and allows the alkali solubility of the binding agent to reduce substantially in a state of non-decomposition.

JP-A-10-282643 discloses that in alkali development, the factor of residuary membrane in unexposed portions is improved by adding an organic acid to a positive type photosensitive composition containing a light-heat converting substance and an alkali-soluble resin. Furthermore, JP-A-2001-324808 discloses a positive type photosensitive composition containing a light-heat converting substance and a particular mass ratio of a novolak resin and an acrylic resin, thereby to obtain a system having a high sensitivity and an improved factor of residuary membrane in the unexposed portions. Furthermore, JP-A-11-143076, JP-A-11-190903, and the like disclose that a combination of an alkali-soluble resin having phenolic hydroxyl groups and an acidic color-developing dye or a basic color-developing dye allows improvement in the factor of residuary membrane of the unexposed portions and the contrast between the unexposed and exposed portions.

However, also in the techniques as disclosed above, the difference in alkali solubility between the exposed and unexposed portions (the so-called dissolution discrimination) is not large, resulting in insufficient latitude in development. In addition, further improvement in sensitivity also is desired in order to heighten productivity in the platemaking of the lithographic printing plate.

SUMMARY OF THE INVENTION

The object of the invention is to overcome the defects of the aforesaid conventional techniques and provide an infrared sensitive composition, which have a large difference in alkali solubility between the exposed and unexposed portions (dissolution discrimination), an excellent latitude in development, and a high sensitivity when the composition is used for the image-forming layer of the lithographic printing plate precursor, and provide a lithographic printing plate precursor, which have a large difference in alkali solubility between the exposed and unexposed portions (dissolution discrimination), an excellent latitude in development, and a high sensitivity.

The aforesaid problems of the invention were solved by the following means.

1. An infrared sensitive composition comprising:

(A) an alkali-soluble resin having a phenolic hydroxyl group;

(B) a light-heat converting substance; and (C) a leucohydroxy dye.

2. The infrared sensitive composition as described in the item 1, wherein the leucohydroxy dye is a compound represented by the following general formula (I):

(I)

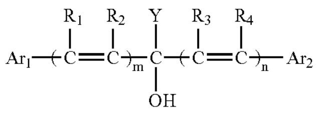

wherein $Ar_1$ and $Ar_2$ each maybe the same or different and represent an aryl group or a heteroaryl group, which may have a substituent group; $R_1$ to $R_4$ each may be the same or different and represent a hydrogen atom or an alkyl group which may have a substituent; Y represents a hydrogen atom, or an alkyl, aryl or heteroaryl groups which may have a substituent; when at least one of $Ar_1$ and $Ar_2$, or Y is an aryl group, at least one of $Ar_1$, $Ar_2$ and Y has as a substituent a hydroxy group, an amino group, a monoalkylamino group or a dialkylamino group at the ortho or para position; two of $Ar_1$, $Ar_2$ and Y may link together through a connecting group to from a ring; m and n each represent 0 or 1.

3. The infrared sensitive composition as described in the item 1 or 2, which comprises the alkali-soluble resin (A) in an amount of from 30 to 99 weight percent.

4. The infrared sensitive composition as described in any one of the items 1 to 3, which comprises the light-heat converting substance (B) in an amount of from 0.01 to 50 weight percent.

5. The infrared sensitive composition as described in any one of the items 1 to 4, which comprises the leucohydroxy dye (C) in an amount of from 0.01 to 15 weight percent.

6. A lithographic printing plate precursor comprising a support and an image-forming layer, wherein the image-forming layer comprises:

(A) an alkali-soluble resin having a phenolic hydroxyl group;

(B) a light-heat converting substance; and (C) a leucohydroxy dye.

7. The lithographic printing plate precursor as described in the item 6, wherein the leucohydroxy dye is a compound represented by the following general formula (I):

(I)

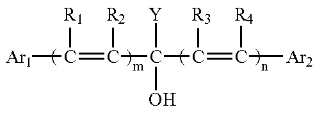

wherein $Ar_1$ and $Ar_2$ each may be the same or different and represent an aryl group or a heteroaryl group, which may have a substituent group; $R_1$ to $R_4$ each may be the same or different and represent a hydrogen atom or an alkyl group which may have a substituent; Y represents a hydrogen atom, or an alkyl, aryl or heteroaryl groups which may have a substituent; when at least one of $Ar_1$ and $Ar_2$, or Y is an aryl group, at least one of $Ar_1$, $Ar_2$ and Y has as a substituent a hydroxy group, an amino group, a monoalkylamino group or a dialkylamino group at the ortho or para position; two of $Ar_1$, $Ar_2$ and Y may link together through a connecting group to from a ring; m and n each represent 0 or 1.

8. The lithographic printing plate precursor as described in the item 6 or 7, wherein the image-forming layer comprises the alkali-soluble resin (A) in an amount of from 30 to 99 weight percent.

9. The lithographic printing plate precursor as described in anyone of the items 6 to 8, wherein the image-forming layer comprises the light-heat converting substance (B) in an amount of from 0.01 to 50 weight percent.

10. The lithographic printing plate precursor as described in any one of the items 6 to 9, wherein the image-forming layer comprises the leucohydroxy dye (C) in an amount of from 0.01 to 15 weight percent.

Although the mechanism of this invention is still ambiguous in some points, the action of the leucohydroxy dyes (C) introduced is thought to impede the alkali dissolution of the unexposed portions and promote the alkali solubility of the exposed portions.

DETAILED DESCRIPTION OF THE INVENTION

The ingredients of the infrared sensitive composition of the invention are illustrated below in detail.

[Alkali-Soluble Resins Having Phenolic Hydroxyl Group (A)]

The alkali-soluble resins used in the invention (Hereinafter occasionally referred to as “alkali-soluble polymers”) are water-insoluble and alkali-soluble polymeric compounds, including homopolymers, copolymers, or mixtures thereof which have a phenolic hydroxyl group on the main chain and/or side chain thereof. Accordingly, the heat-sensitive layer relating to the invention has the property of dissolving in contact with an alkaline developer after exposure to an infrared laser.

The alkali-soluble polymers used in the invention are not particularly limited as long as the polymers have been known so far, and for example, include the following polymers but are not limited to the polymers.

(1) Novolak or Resol Resins

Novolak resins and resol resins are included in which phenol, cresols (o-, m-, and p-derivatives), xylenols (2,3-, 2,5- 3,5-derivatives, etc.), resorcin, and pyrogallol are appropriately mixed and condensed with formaldehyde. Of these resins, the novolak resins are preferred, and examples thereof include novolak resins such as phenol formaldehyde resins, m-cresol formaldehyde resins, p-cresol formaldehyde resins, m-/p-mixed cresol formaldehyde resin, phenol/cresol (either of m-, p- or m-/p-mixed)-mixed formaldehyde resins, phenol/xylenol (either of 2,3-, 2,5-, 3,5- or a mixture thereof)-mixed formaldehyde resins, phenol/cresol (either of m-, p-, or m-/p-mixed)/xylenol (either 2,3-, 2,5-, 3,5- or a mixture thereof)-mixed formaldehyde resins, phenol/xylenol (either of 2,3- 2,5-, 3,5- or a mixture thereof)/resorcin or pyrogallol-mixed formaldehyde resins, and cresol/xylenol (either of 2,3- 2,5- 3,5- or a mixture thereof)/resorcin or pyrogallol-mixed formaldehyde resins, and moreover resorcin or pyrogallol acetone resins.

(2) Polymeric Compounds having Phenolic Hydroxyl Groups on Side Chains

The polymeric compounds having phenolic hydroxyl groups on the side chains include polymeric compounds prepared by homopolymerization of a polymerizable monomer that is a low molecular weight compound having one or more phenolic hydroxyl group and one or more polymerizable unsaturated bond, respectively, and copolymerization of the monomer with another polymerizable monomer.

The polymerizable monomer having a phenolic hydroxyl group includes acrylamides, methacrylamides, acrylic esters, and methacrylic esters that have a phenolic hydroxyl group, hydroxystyrenes, and the like. Specific examples of the polymerizable monomers used preferably include N-(2-hydroxyphenyl)acrylamide, N-(3-hydroxyphenyl)acrylamide, N-(4-hydroxyphenyl)acrylamide, N-(2-hydroxyphenyl)-methacrylamide, N-(3-hydroxyphenyl) methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 3-methyl-p-hydroxystyrene, 3-methoxy-p-hydroxystyrene, 2-(2-hydroxyphenyl) ethyl acrylate, 2-(3-hydroxyphenyl) ethyl acrylate, 2-(4-hydroxyphenyl)ethyl acrylate, 2-(2-hydroxyphenyl)ethyl methacrylate, 2-(3-hydroxyphenyl)ethyl methacrylate, 2-(4-hydroxyphenyl)ethyl methacrylate, and the like. Polyhydroxystyrenes (o-, m-, and p-hydroxystyrenes, 3-substituted-4-hydroxystyrenes and copolymers thereof) are more suitable.

In the invention, when the polymeric compound having phenolic hydroxyl groups on the side chains is a copolymer of the polymerizable monomer having a phenolic hydroxyl group and another polymerizable monomer, the polymeric compound preferably contain the monomer having a phenolic hydroxyl group in a ratio of 10 mole percent or more and more preferably 20 mole percent or more. The ratio less than 10 mole percent results in insufficient alkali solubility in some cases, failing to exert a sufficient effect on enlargement of the latitude in development.

The another polymerizable monomer copolymerizable with the polymerizable monomer having a phenolic hydroxyl group includes compounds shown in the following (m1)–(m12), but is not limited to these compounds.

(m1) Acrylic esters and methacrylic esters having an aliphatic hydroxyl group, including 2-hydroxyethyl acrylate, 2-hydroxyethyl methacrylate, and the like.

(m2) Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, and glycidyl acrylate.

{m3} Alkyl methacrylates such as methyl methacrylate, ethyl methacrylate, propyl methacrylate, butyl methacrylate, amylmethacrylate, hexylmethacrylate, cyclohexylmethacrylate, benzyl methacrylate, 2-chloroethyl methacrylate, and glycidyl methacrylate.

(m4) Acrylamides and methacrylamides such as acrylamide, methacrylamide, N-methylolacrylamide, N-ethylacrylamide, N-hexylmethacrylamide, N-cyclohexylacrylamide, N-hydroxylethylacrylamide, N-phenylacrylamide, N-nitrophenyl-acrylamide, and N-ethyl-N-phenylacrylamide.

(m5) Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(m6) Vinyl esters such as vinyl acetate, vinyl chloroacetate, vinyl butylate, and vinyl benzoate.

(m7) Styrenes such as styrene, α-methylstyrene, methylstyrenes, and chloromethylstyrenes.

(m8) Vinyl ketones such as methyl vinyl ketone, ethyl vinyl ketone, propyl vinyl ketone, and phenyl vinyl ketone.

(m9) Olefins such as ethylene, propylene, isobutylene, butadiene, and isoprene.

(m10) N-Vinylpyrrolidone, acrylonitrile, and methacrylonitrile, and the like.

(m11) Unsaturated imides such as maleimide, N-methylmaleimide, N-cyclohexylmaleimide, and N-phenylmaleimide.

(m12) Unsaturated carboxylic acids such as acrylic acid, methacrylic acid, maleic anhydride, and itaconic acid.

The alkali-soluble polymeric compounds can be prepared by known graft copolymerization, block copolymerization, random copolymerization, and the like.

About the molecular weight of the alkali-soluble resins having phenolic hydroxyl groups of the invention, in the case of the aforesaid novolak resins or resol resins, the weight average molecular weight Mw thereof is preferably from 500 to 20,000 and more preferably from 1000 to 10,000, and the number average molecular weight Mn thereof is preferably from 200 to 5000 and more preferably from 500 to 3000. The dispersion (Mw/Mn) is in the range of from 3 to 12. In the case of the polymeric compounds having phenolic hydroxyl groups on the side chains, it is preferable that the weight average molecular weight is more than 2000 and the number average molecular weight is more than 500. It is further preferable that the weight average molecular weight is from 5000 to 300,000, the number average molecular weight is from 800 to 100,000, and the dispersion (Mw/Mn) is from 1.1 to 8. Too small molecular weight fails to give sufficient films and too large molecular weight tends to cause the development properties to deteriorate.

These alkali-soluble resins having phenolic hydroxyl groups can be used singly or as mixtures of two or more thereof.

The content of the alkali-soluble resins in the total solid content of the composition is preferably from 30 to 99 mass percent, more preferably from 40 to 95 mass percent, and particularly preferably from 50 to 90 mass percent. The content less than 30 mass percent causes durability of the heat-sensitive layer to deteriorate, and exceeding 99 mass percent leads to deterioration both in sensitivity and durability.

[Light-Heat Converting Substances (B)]

The light-heat converting substances used in the invention are not particularly limited as long as the substances absorb infrared rays and emit heat, and various pigments known as infrared-absorbing pigments can be used as well as infrared-absorbing dyes. The infrared-absorbing dyes are preferred. The following dyes are exemplified, but usable dyes are not limited to these dyes.

As the infrared-absorbing dyes relating to the invention, commercially available dyes and known dyes as described in literatures (e.g., "Senryo Binran" (Handbook of Dyes), edited by Yukigoseikagaku-kyokai, 1970) can be used. Specific examples of such dyes include azo dyes, metal complex azo dyes, pyrazolone azo dyes, anthraquinone dyes, phthalocyanine dyes, carbonium dyes, quinoneimine dyes, methine dyes, cyanine dyes, and the like. Of these dyes, dyes absorbing infrared or near infrared rays are particularly preferred from the viewpoint of use for lasers emitting infrared or near infrared rays.

Examples of the dyes absorbing infrared or near infrared rays include cyanine dyes as described in JP-A-58-125246, JP-A-59-84356, JP-A-59-202829, JP-A-60-78787 and the like, methine dyes as described in JP-A-58-173696, JP-A-58-181690, JP-A-58-194595, and the like, naphthoquinone dyes as described in JP-A-58-112793, JP-A-58-224793, JP-A-59-48187, JP-A-59-73996, JP-A-60-52940, JP-A-60-63744, and the like, squalilium dyes as described in JP-A-58-112792 and the like, cyanine dyes as described in British Patent 434,875, and the like.

Furthermore, as the dyes, near infrared-absorbing sensitizers as described in U.S. Pat. No. 5,156,938 also can be appropriately used, substituted arylbenzo(thio)pyrylium salts as described in U.S. Pat. No. 3,881,924, trimethinethiapyrylium salts as described in JP-A-57-142645 (U.S. Pat. No. 4,327,169), pyrylium compounds as described in JP-A-58-181051, JP-A-58-220143, JP-A-59-41363, JP-A-59-84248, JP-A-59-84249, JP-A-59-146063, and JP-A-59-146061, cyanine dyes as described in JP-A-59-216146, pentamethinethiopyrylium salts and the like as described in U.S. Pat. No. 4,283,475, pyrylium compounds and the like as disclosed in JP-B-5-13514 and JP-B-5-19702, and as commercially available products, Epolight III-178, Epolight III-130, Epolight III-125, and the like manufactured by Epolin Co. are particularly preferably used.

Furthermore, other examples of particularly preferred dyes include near infrared-absorbing dyes represented by formulas (I) and (II) as described in U.S. Pat. No. 4,756,993.

The infrared-absorbing pigments usable include commercially available pigments and pigments described in "Color Index (C.I.) Binran" (Handbook of Color Indexes); "Saishin Ganryo Binran" (Handbook of the Latest Pigments), edited by Nippon Ganryogijutsu-kyokai, 1977; "Saishin Ganryo Oyo Gijutsu" (The Latest Applied Techniques of Pigments), Published by CMC Shuppan, 1986; and "Insatsu Ink Gijutsu" (Techniques of Printing Ink), published by CMC Shuppan, 1984.

The pigments include black pigments, yellow pigments, orange pigments, brown pigments, red pigments, purple pigments, blue pigments, green pigments, fluorescent pigments, metallic powder pigments, and polymer-linked coloring materials. Specific examples of the pigments include insoluble azo pigments, azo lake pigments, condensed azo pigments, chelate azo pigments, phthalocyanine pigments, anthraquinone pigments, perylene and perylenone pigments, thioindigo pigments, quinacridone pigments, dioxazine pigments, isoindolinone pigments, quinophthalone pigments, in-mold decorating lake pigments, azine pigments, nitroso pigments, nitro pigments, natural pigments, fluorescent pigments, inorganic pigments, carbon black, and the like.

These pigments can be used without undergoing a surface treatment, or those having undergone surface treatments also can be used. For the surface treatments, there are a method of coating the surfaces of the pigments with resin or wax, a method of allowing a surfactant to adhere to the surfaces thereof, and a method of allowing a reactive substance (e.g., silane coupling agents, epoxy compounds, or polyisocyanates) to adhere to the surface thereof. These methods are described in "Kinzokusekken no Seishitu to Oyo" (Nature and Application of Metal Soap), published by Saiwai Shobo, "Insatsu Ink Gijutsu" (Techniques of Printing Ink), published by CMC Shuppan, 1984, and "Saishin Ganryo Oyo Gijutsu" (The Latest Applied Techniques of Pigments), published by CMC Shuppan, 1986.

The particle size of the pigments preferably falls in the range of from 0.01 to 10 μm, more preferably from 0.05 to 1 μm, and particularly preferably from 0.1 to 1 μm. The particle size less than 0.01 μm is unpreferred in view of stability of a dispersion in a coating liquid for a recording layer, and exceeding 10 μm is unpreferred in view of uniformity of the recording layer.

For dispersing the pigments, known dispersion techniques for manufacturing of ink and toner can be applied. Dispersing machines used include ultrasonic dispersing machines, sand mills, attritors, pearl mills, super mills, ball mills, impellers, dispersers, KD mills, colloid mills, dynatrons, triple roll mills, pressure kneaders, and the like. Details of these techniques are described in "Saishin Ganryo Oyo Gijutsu" (The Latest Applied Techniques for Pigments), published by CMC Shuppan, 1986.

In the invention the content of the light-heat converting substances in the total solid content of the photosensitive compositions is preferably from 0.01 to 50 mass percent, more preferably from 0.1 to 10 mass percent, and further preferably from 0.5 to 10 mass percent. The content less than 0.01 mass percent tends to cause the sensitivity to reduce, and exceeding 50 mass percent results in losing uniformity of the heat-sensitive layer and tends to cause the durability of the heat-sensitive layer to deteriorate.

[Leucohydroxy Dyes (C)]

The leucohydroxy dyes (C) of the invention are dyes in which a hydroxy group links to the carbon atom of the conjugation center in place of a hydrogen atom in the so-called leuco dyes (reduction-type dyes), and have structures represented by general formula (I):

(I)

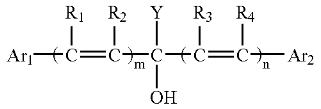

In the formula $Ar_1$ and $Ar_2$ each may be the same or different from each other and represent an aryl group or a heteroaryl group which may have a substituent group, $R_1$ to $R_4$ each may be the same or different from one another and represent a hydrogen atom or an alkyl group which may have a substituent group, and Y represents a hydrogen atom, or an alkyl group, an aryl group, or a heteroaryl group which may have a substituent group. Herein, when at least one of $Ar_1$ and $Ar_2$ or Y is an aryl group, at least one of $Ar_1$, $Ar_2$, and Y has as a substituent group a hydroxy group, an amino group, a monoalkyl group, or a dialkylamino group at the ortho or para position. Furthermore, two of $Ar_1$, $Ar_2$, and Y link together through a connecting group to form a ring. m and n represent 0 or 1.

The aforesaid alkyl group is, for example, an alkyl group having one to eight carbon atoms, and preferred examples thereof include a methyl group, an ethyl group, a propyl group, an n-butyl group, a sec-butyl group, a hexyl group, a 2-ethylhexyl group, and an octyl group which may have a substituent group.

The aryl group is, for example, an aryl group having six to 15 carbon atoms, and preferred examples thereof include a phenyl group, a tolyl group, a dimethylphenyl group, a naphthyl group, an anthryl group which may have a substituent group.

The heteroaryl group is preferably a five- or six-member heterocycle having aromaticity, and examples thereof include a furan ring, a benzofuran ring, a thiophene ring, benzothiophene ring, a pyrrole ring, an indole ring, a pyrrolidine ring, a pyridine ring, and a piperazine ring.

The rings formed by allowing two of $Ar_1$, $Ar_2$, and Y to link together through a connecting group include five to seven-member rings formed through an oxygen atom, a sulfur atom, a nitrogen atom, or an alkylene group.

Substituent groups by which the aforesaid groups may be substituted include groups having an active hydrogen such as an amido group, a ureido group, and a hydroxyl group, halogen atoms (fluorine atom, chlorine atom, bromine atom, and iodine atom), alkoxy groups (methoxy group, ethoxy group, propoxy group, butoxy group, etc.), thioether groups, acyl groups (acetyl group, propanoyl group, benzoyl group, etc.), an amino group, alkylamino groups (methylamino group, ethylamino group, etc.), dialkylamino groups (dimethylamino group, diethylamino group, dipropylamino group, pyrrolidyl group), a cyano group, a nitro group, and the like.

The compounds represented by general formula (I) may be compounds containing plural leucohydroxy dye structures through a Y group in a molecule (i.e., a multimer structure).

The compounds represented by general formula (I) can be synthesized, for example, by adding a Grignard reagent, an organic lithium reagent, or the like to a diaryl ketone having a substituent group.

Although specific examples of the compounds represented by general formula (I) are shown below, the invention is not to be construed as limited to these examples.

(I-1)

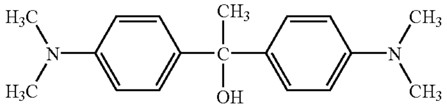

(I-2)

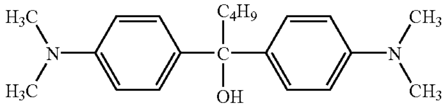

(I-3)

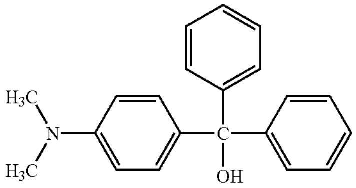

(I-4)

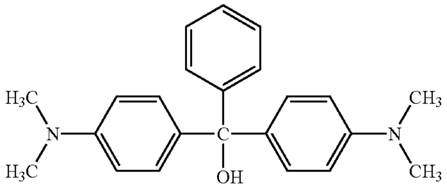

(I-5)

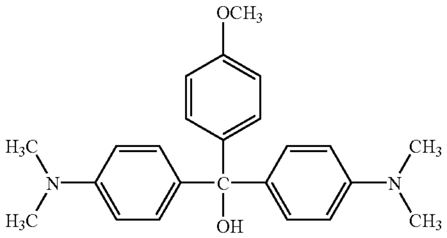

(I-6)

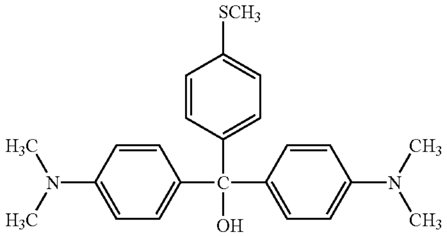

-continued (I-7)

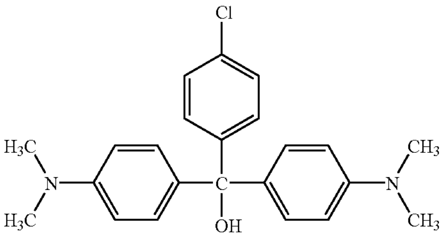

(I-8)

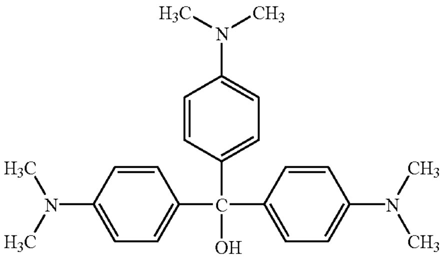

(I-9)

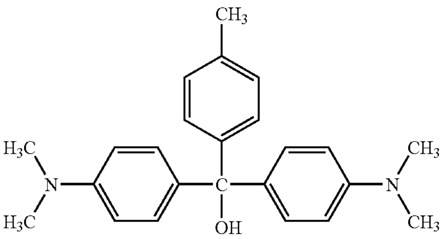

(I-10)

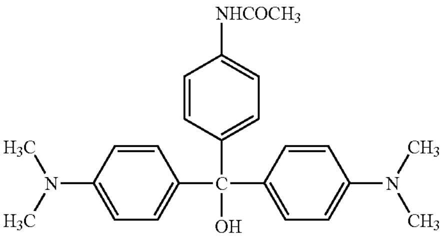

(I-11)

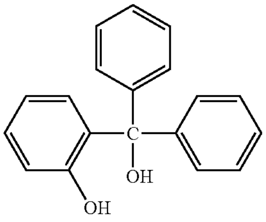

(I-12)

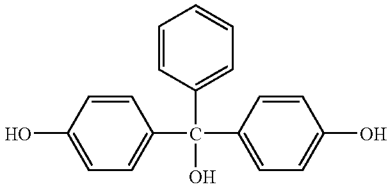

-continued (I-13)

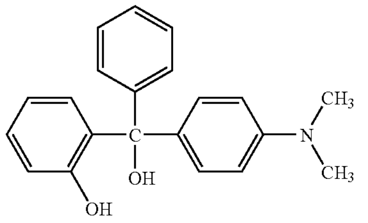

(I-14)

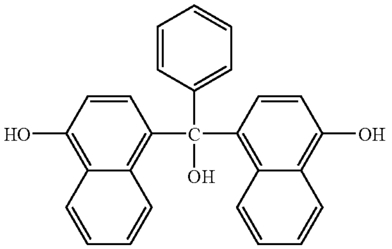

(I-15)

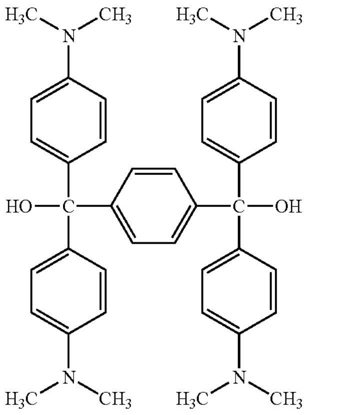

(I-16)

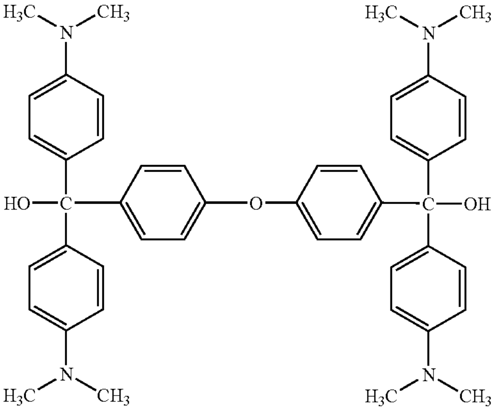

In the invention, the content of the leucohydroxy dyes (C) represented by general formula (I) in the total solid content of the photosensitive compositions is preferably from 0.01 to 15 mass percent, more preferably from 0.05 to 7 mass percent, and further preferably from 0.3 to 5 mass percent.

[Other Ingredients]

In the formation of the infrared sensitive compositions of the invention, various additives other than the aforesaid essential ingredients can be added as needed as long as the effect of the invention is not marred. Examples of such ingredients are illustrated below.

For example, joint use of substances such as onium salts, o-quinonediazide compounds, aromatic sulfone compounds, and aromatic solfonic esters which are thermally decomposable but lower substantially the solubility of the alkali-soluble polymeric compounds in an undecomposed state are preferred in view of improvement in capability to impede dissolution of the image areas in the developers. Examples of the onium salts include diazonium salts, ammonium salts, phosphonium salts, iodonium salts, sulfonium salts, selenonium salts, arsonium salts, and the like.

Examples of the onium salts used preferably in the invention include diazonium salts as described, for example, in S. I. Schlesinger, Photogr. Sci. Eng., 18, 387 (1974), T. S. Bal, et al., Polymer, 21, 423 (1980), and JP-A-5-158230, ammonium salts as described in U.S. Pat. Nos. 4,069,055 and 4,069,056, and JP-A-3-140140, the phosphonium salts as described in D. C. Necker, et al., Macromolecules, 17, 2468 (1984), C. S. Wen, et al., The, Proc. Conf. Rad. Curing ASIA, p478, Tokyo, October (1988), and U.S. Pat. Nos. 4,069,055 and 4,069,056, the iodonium salts as described in J. V. Crivello, et al., Macromolecules, 10(6), 1307 (1977), Chem. & Eng. News, November 28, p31 (1988), European Patent No. 104,143, U.S. Pat. Nos. 339,049 and 410,201, JP-A-2-150848, and JP-A-2-296514, sulfonium salts as described in J. V. Crivello, et al., Polymer J. 17, 73 (1985), J. V. Crivello, et al., J. Org. Chem., 43, 3055 (1978), W. R. Watt, et al., J. Polymer Sci., Polymer Chem Ed., 22, 1789 (1984), J. V. Crivello, et al., Polymer Bull., 14, 279 (1985), J. V. Crivello, et al., Macromolecules, 14(5), 1141 (1981), J. V. Crivello, et al., J. Polymer Sci., Polymer Chem. Ed., 17, 2877 (1979), European Patent Nos. 370,693,233,567, 297,443, and 297,442, U.S. Pat. Nos. 4,933,377, 3,902,114, 410,201, 339,049, 4,760,013, 4,734,444, and 2,833,827, and German Patent Nos. 2,904,626, 3,604,580, and 3,604,581, the selenonium salts as described in J. V. Crivello, et al., Macromolecules, 10(6), 1307 (1977), J. V. Crivello, et al., J. Polymer Sci., Polymer Chem. Ed., 17, 1047 (1979), the arsonium salts as described in C. S. Wen, et al., Teh, Proc. Conf. Rad. Curing ASIA, p478 Tokyo, October (1988), and the like.

Of these onium salts, the diazonium salts are particularly preferred. Particularly preferred diazonium salts are those as described in JP-A-5-158230.

Examples of the counter ions in the onium salts include anions from tetrafluoroboric acid, hexafluorophosphoric acid, triisopropylnaphthalenesulfonic acid, 5-nitro-o-toluene-sulfonic acid, 5-sulfosalicylic acid, 2,5-dimethyl-benzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoylbenzenesulfonic acid, p-toluenesulfonic acid, and the like. Of these acids, alkyl aromatic sulfonic acids such as hexafluorinated phosphoric acid, triisopropylnaphthalenesulfonic acid, and 2,5-dimethylbenzenesulfonic acid are suitable.

Suitable quinonediazides include o-quinonediazide compounds. The o-quinonediazides used in the invention are compounds having at least one o-quinonediazide group and increasing alkali-solubility depending upon the thermal decomposition, and such compounds having various structures can be used. That is, the o-quinonediazides have both effects of losing a capability of the binding agent to impede the dissolution and allowing the o-quinonediazides themselves to turn into the alkali-soluble substances by the thermal decomposition, thus promoting the solubility of the sensitive materials. The o-quinonediazide compounds used in the invention include, for example, compounds described in J. Kosar, "Light-Sensitive Systems" p. 339–352, John Wiley & Sons, Inc., and the sulfonic esters or sulfonamides of o-quinonediazides allowed to react with various aromatic polyhydroxy compounds or aromatic amino compounds are particularly suitable. Esters of pyrogallol-acetone resins with benzoquinone-(1,2)-diazidesuflonic chloride or naphthoquinone-(1,2)-diazide-5-suflonic chloride as described in JP-B-43-28403 and esters of phenol-formaldehyde resins with benzoquinone-(1,2)-diazidesulfonic chloride or naphthoquinone-(1,2)-diazide-5-sulfonic chloride as described in U.S. Pat. Nos. 3,046,120 and 3,188,210 also are suitably used.

Furthermore, esters of naphthoquinone-(1,2)-diazide-4-sulfonic chloride with phenol-formaldehyde resins or cresol-formaldehyde resins and esters of naphthoquinone-(1,2)-diazide-4-sulfonic chloride with pyrogallol-acetone resins also are suitably used. Other useful o-quinonediazide compounds are disclosed and known in a number of patents.

The other useful o-quinonediazide compounds are described, for example, in JP-A-47-5303, JP-A-48-63802, JP-A-48-63803, JP-A-48-96575, JP-A-49-38701, JP-A-48-13354, JP-B-41-11222, JP-B-45-9610, JP-B-49-17481, U.S. Pat. Nos. 2,797,213, 3,454,400, 3,544,323, 3,573,917, 3,674,495, and 3,785,825, British Patent Nos. 1,227,602, 1,251,345, 1,267,005, 1,329,888, and 1,330,932, German Patent 854,890, and the like.

The content of the o-quinonediazide compounds in the total solid content of the compositions of the invention is preferably in the range of from 1 to 50 mass percent, more preferably from 5 to 30 mass percent, and particularly preferably from 10 to 30 mass percent. These compounds can be used singly or as mixtures of several thereof.

The contents of other additives than the o-quinonediazide compounds in the total solid content of the invention are preferably from 1 to 50 mass percent, more preferably from 5 to 30 mass percent, and particularly preferably from 10 to 30 mass percent.

In order to strengthen the discrimination of images and the resistance to scratching of the surfaces, joint use of a polymer is preferred, which is prepared as a polymerization ingredient from a (meth) acrylate monomer containing two or three perfluoroalkyl groups having three to 20 carbon atoms in a molecule as described in JP-A-2000-187318. The content of the polymer in the compositions is preferably from 0.1 to 10 mass percent and more preferably from 0.5 to 5 mass percent.

In the infrared sensitive composition of the invention, a compound for reducing the coefficient of static friction of the surface can be added to impart the resistance to scratching. Specific examples of the compound include alkyl esters of long-chain carboxylic acids as described in U.S. Pat. No. 6,117,913. The content of the compound in the compositions is preferably from 0.1 to 10 mass percent and more preferably from 0.5 to 5 mass percent.

Furthermore, the infrared sensitive compositions of the invention can contain a low molecular weight compound having an acidic group as needed to promote the solubility. The acidic group includes groups having a pKa value of from 7 to 11 such as a thiol group, a phenolic hydroxyl group, a sulfonamido group, and an active methylene group.

The content of the compound in the compositions is preferably from 0.05 to 5 mass percent and more preferably from 0.1 to 3 mass percent. Exceeding 5 mass percent unpreferably tends to cause the solubility of the respective layers to increase in a developer.

Furthermore, in the invention, various agents for impeding the dissolution can be contained in order to control the solubility. Disulfone compounds and sulfone compounds as described in JP-A-11-119418 are suitably used as the agents, and specifically 4,4'-bishydroxyphenylsulfone is preferably used.

The content of the agents for impeding the dissolution in the compositions is preferably from 0.05 to 20 mass percent and more preferably from 0.5 to 10 mass percent.

For the purpose of improving the sensitivity, cyclic acid anhydrides, phenols, or organic acids can be simultaneously used. Examples of the cyclic acid anhydrides usable include phthalic anhydride, tetrahydrophthalic anhydride, hexahydrophthalic anhydride, 3,6-endoxo-Δ4-tetrahydro-phthalic anhydride, tetrachlorophthalic anhydride, maleic anhydride, chloromaleic anhydride, α-phenylmaleic anhydride, succinic anhydride, pyrromellitic anhydride, and the like which are described in U.S. Pat. No. 4,115,128.

Examples of the phenols include bisphenol A, p-nitrophenol, p-ethoxyphenol, 2,4,4'-trihydoxybenzophenone, 2,3,4-trihydroxybenzophenone, 4-hydroxybenzophenone, 4,4',4"-trihydroxytriphenylmethane, 4,4', 3",4"-tetrahydroxy-3,5,3',5'-tetramethyltriphenylmeth ane, and the like.

The organic acids include sulfonic acids, sulfinic acids, alkyl sulfates, phosphonic acids, phosphoric esters, carboxylic acids, and the like which are described in JP-A-60-88942 and JP-A-2-96755, specifically p-toluenesulfonic acid, dodecylbenzenesulfonic acid, naphthalenesulfonic acid, p-toluenesulfinic acid, ethyl sulfate, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cylcohexene-1,2-dicarboxylic acid, erucic acid, lauric acid, n-undecanoic acid, ascorbic acid, and the like.

The content of these cyclic acid anhydrides, phenols, or organic acids in the compositions is preferably from 0.05 to 20 mass percent, more preferably from 0.1 to 15 mass percent, and particularly preferably from 0.1 to 10 mass percent.

For the purpose of enhancing the stability to the treatment of development, the infrared sensitive compositions of the invention can contain non-ionic surfactants as described in JP-A-62-251740 and JP-A-3-208514, ampholytic surfactants as described in JP-A-59-121044 and JP-A-4-13149, siloxane compounds as described in European Patent 950, 517, and copolymers prepared from fluorine-containing monomers as described in JP-A-11-288093. Furthermore, in order to improve the quality of coated surfaces, the compositions can contain surfactants such as fluorine-series surfactants as described in JP-A-62-170950.

Examples of the non-ionic surfactants include sorbitan tristearate, sorbitan monopalmitate, sorbitan trioleate, monoglyceride stearate, polyoxyethylene nonylphenyl ether, and the like. Specific examples of the ampholytic surfactants include alkyldi(aminoethyl)glycine, alkylpolyaminoethylglycine hydrochloride, 2-alkyl-N-caroxyethyl-N-hydroxyethylimidazolium betaine, and N-tetradecyl-N,N-betaines (e.g., "Amorgen K" (trade name) manufactured by Dai-ichi Kogyo Seiyaku Co., Ltd.).

Preferred examples of the siloxane compounds are block copolymers of dimethylsiloxane and polyalkylene oxides, specifically including polyalkylene oxide-modified silicones such as DBE-224, DBE-621, DBE-712, DBP-732, and DBP-534 manufactured by Chisso K. K. and Tego Glide 100 manufactured by Tego Co. (Germany).

The content of the aforesaid surfactants in the compositions is preferably from 0.05 to 15 mass percent and more preferably from 0.1 to 5 mass percent.

The infrared sensitive compositions of the invention can contain dyes and pigments as printing-out agents or image colorants to form a visible image immediately after heating depending upon exposure to a ray.

The printing-out agents are exemplified by a combination of a compound emitting an acid by heating depending upon the exposure to a ray (photo-acid generator) and a salt-formable organic dye. Specific examples of the agents include combinations of o-naphthoquinonediazide-4-sulfonic halogenides and salt-formable organic dyes as described in JP-A-50-36209 and JP-A-53-8128 and combinations of trihalomethyl compounds and salt-formable organic dyes as described in JP-A-53-36223, JP-A-54-74728, JP-A-60-3626, JP-A-61-143748, JP-A-61-151644, and JP-A-63-58440. Such trihalomethyl compounds include oxazole compounds and triazine compounds, which have excellent aging stability and give clear printed-out images, respectively.

Other dyes than the aforesaid salt-formable organic dyes also can be used as the image colorants. Suitable dyes are oil-soluble dyes and basic dyes as well as the salt-formable organic dyes.

Specific examples of the image colorants include Oil Yellow #101, Oil Yellow #103, Oil Pink #312, Oil Green BG, Oil Blue BOS, Oil Blue #603, Oil Black BY, Oil Black BS, Oil Black T-505 (The above dyes are manufactured by Orient Kagaku Kogyo K. K.), Victoria Pure Blue, Crystal Violet (CI42555), Methyl Violet (CI42535), Ethyl Violet, Rhodamine B (CI145170B), Malachite Green (CI42000), Methylene Blue CI52015), and the like. Moreover, dyes as described in JP-A-62-293247 are particularly preferred.

The content of these dyes in the total solid content of the compositions is from 0.01 to 10 mass percent and preferably from 0.1 to 3 mass percent.

Plasticizers are added as needed to the compositions of the invention to impart flexibility to coats. Examples of the plasticizers used include butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid or methacrylic acid.

For the purpose of improving the ink receptivity of images, a variety of resins having hydrophobic groups can be added to the compositions of the invention, including, for example, octylphenol-formaldehyde resins, t-butylphenol-formaldehyde resins, t-butylphenol-benzaldehyde resins, rosin-modified novolak resins, and o-naphthoquinone-diazidesulfonic esters of these modified novolak resins. The content of these resins in the total mass of the compositions is preferably in the range of from 0.01 to 30 mass percent.

In order to further improve the wear resistance of coats, known resins can be added to these compositions. Examples the resins include polyvinylacetal resins, polyurethane resins, epoxy resins, vinyl chloride resins, nylons, polyester resins, acrylic resins, and the like. These resins can be used singly or as mixtures thereof. The content of the resins in the total mass of the compositions is preferably in the range of from 2 to 40 mass percent.

The composition of the invention is preferably used for an image-forming layer (Hereinafter occasionally referred to asa "photosensitive layer") for the lithographic printing plate precursor.

When a photosensitive material for the lithographic printing plate precursor is prepared from the infrared sensitive composition of the invention, first, the composition is provided as the image-forming layer on an appropriate support.

The case where the photosensitive composition of the invention is used as the image-forming layer for the lithographic printing plate precursor is illustrated below.

The photosensitive resin composition is dissolved or dispersed in the following organic solvents which are used singly or as mixtures thereof, coated on the support, and dried.

Although all known and conventional organic solvents can be used, solvents having a boiling point in the range of from 40 to 200° C. and particularly from 60 to 160° C. are selected because of the advantage in drying.

Examples of the organic solvents include alcohols such as methyl alcohol, ethyl alcohol, n- or iso-propyl alcohol, n- or iso-butyl alcohol, and diacetone alcohol, ketones such as acetone, methyl ethyl ketone, methyl propyl ketone, methyl butyl ketone, methyl amyl ketone, methyl hexyl ketone, diethyl ketone, diisobutyl ketone, cyclohexanone, methylcyclohexanone, and acetylacetone, hydrocarbons such as benzene, toluene, xylene, cyclohexane, and methoxybenzene, acetic esters such as ethyl acetate, n- or iso-propyl acetate, n-or iso-butyl acetate, ethylbutyl acetate, and hexyl acetate, halides such as methylene dichloride, ethylene dichloride, and monochlorobenzene, ethers such as isopropyl ether, n-butyl ether, dioxane, dimethyldioxane, and tetrahydrofuran, polyhydric alcohols and their derivatives such as ethylene glycol, methyl cellosolve, methyl cellosolve acetate, ethyl cellosolve, diethyl cellosolve, cellosolve acetate, butyl cellosolve, butyl cellosolve acetate, methoxymethoxyethanol, diethylene glycol monomethyl ether, diethylene glycol dimethyl ether, diethylene glycol methyl ethyl ether, diethylene glycol diethyl ether, propylene glycol, propylene glycol monomethyl ether, propylene glycol monomethyl ether acetate, propylene glycol monoethyl ether, propylene glycol monoethyl ether acetate, propylene glycol monobutyl ether, and 3-methyl-3-methoxybutanol, and special solvents such as dimethyl sulfoxide and N,N-dimethylformamide. These solvents can be appropriately used singly or as mixtures thereof. The concentration of the solid content in the compositions is suitably from 2 to 50 mass percent.

Examples of methods for coating the compositions of the invention include roll coating, dip coating, air-knife coating, gravure coating, offset gravure coating, hopper coating, blade coating, wire doctor coating, spray coating, and the like. The amount of coating is preferably from 0.3 to 4.0 grams/$m^2$ after drying. As the amount of coating decreases, the amount of exposure to obtain an image also decreases, but the strength of the coat also decreases. Although an increased amount of coating requires an increased amount of exposure, the photosensitive coat is strengthened to obtain a printing forme by which a large number of printed sheets are obtained (high in plate wear).

Drying of the photosensitive composition coated on the support in general is carried out by heated air. The heating is preferably carried out in the range of from 30 to 200° C. and particularly from 40 to 140° C. As well as a method where the temperature for the drying is kept constant while drying, a method where the temperature can be stepwise increased while drying also can be carried out. Furthermore, drying air may bring about a good result by removing moisture therefrom in some cases. The heated air is preferably fed to coated surfaces in a rate of from 0.1 to 30 m/sec and more preferably from 0.5 to 20 m/sec.

[Supports]

The supports used for the photosensitive lithographic printing plate precursors are dimensionally stable sheet-like substances and include the supports for conventional printing formes, which can be preferably used also for the present purpose. Examples of such supports include paper and paper laminated with plastics (e.g., polyethylene, polypropylene, or polystyrene), metallic sheets such as aluminum (containing aluminum alloys), zinc, iron, and copper, plastic films such as cellulose diacetate, cellulose triacetate, cellulose propionate, cellulose lactate, cellulose lactate acetate, cellulose nitrate, polyethylene terephthalate, polyethylene, polystyrene, polypropylene, polycarbonate, and polyvinyl acetate, paper or plastic films laminated to or deposited with metals as described above. However, aluminum sheets are particularly preferred. The aluminum sheets contain therein pure aluminum sheets and aluminum alloys. Various aluminum alloys containing metals such as silicon, copper, manganese, magnesium, chromium, zinc, lead, bismuth, and nickel are used. These alloys are contaminated with iron and titanium and moreover a negligible amount of other impurities.

The supports are subjected to surface treatments as needed. For example, in the photosensitive lithographic printing plate precursor, the supports undergo a hydrophilic surface-forming treatment. It is preferred that the supports having the surface of a metal, particularly aluminum, are subjected to surface treatments such as sand dressing, dipping in an aqueous solution of sodium silicate, potassium fluorozirconate, a phosphoric salt, or the like, or anodizing. An aluminum sheet having undergone treatments of sand dressing and then dipping in an aqueous solution of sodium silicate as described in U.S. Pat. No. 2,714,066 and an aluminum sheet having undergone treatments of anodizing and then dipping in an aqueous solution of an alkali silicate as described in U.S. Pat. No. 3,181,461 also are preferably used.

The anodizing treatment is carried out by allowing electricity to pass through an aluminum sheet as an anode in an electrolyte prepared from one or a combination of two or more of aqueous solutions or non-aqueous solutions of inorganic acids such as phosphoric acid, chromic acid, sulfuric acid, and boric acid, organic acids such as oxalic acid and sulfamic acid, and salts thereof.

The electrolytic deposition of a silicate as described in U.S. Pat. No. 3,658,662 also is effective. These hydrophilic surface-forming treatments are carried out for the purposes of preventing the surfaces of the supports from harmful reactions with the photosensitive compositions provided thereon and improving the adhesion to the photosensitive layers as well as the purpose of making the surfaces of supports hydrophilic. Prior to the sand dressing of the aluminum sheets, it is possible to carry out the removal of rolling oil from the surfaces and a pretreatment of the surfaces to develop clean aluminum surfaces as needed.

For the former treatment, solvents such as trichlene, surfactants, or the like are used. For the latter treatment, alkaline etching agents such as sodium hydroxide or potassium hydroxide are widely used.

For the sand dressing, all of mechanical, chemical, and electrochemical methods are effective. For the mechanical methods there are ball abrasion, abrasive blasting, and brush abrasion where the aqueous slurry of an abrasive such as pumice powder is rubbed with a nylon brush against the surfaces, as the chemical method it is suitable to dip in a saturated aqueous solution of the aluminum salt of a mineral acid, and as the electrochemical method it is preferred to carry out AC electrolysis in an acidic electrolytic solution such as hydrochloric acid, nitric acid, or combined acids thereof. Of these surface-roughening methods, a combination of mechanical surface roughening and electrochemical surface roughening as described in JP-A-55-137993 is preferred because of strong adhesion of fat-sensitive images to the supports. It is preferable to carry out the sand dressing according to the aforesaid method so that the center line surface roughness (Ra) of the aluminum surfaces falls in the range of from 0.3 to 1.0 μm. The aluminum sheets having undergone the sand dressing are subjected to washing with water and chemical etching as needed.

The etching agents in general are selected from aqueous solutions of bases or acids that dissolve aluminum. In this case, the etching agents should not form films derived from components of the etching solutions on the etched surfaces and different from aluminum. Preferred examples of the etching agents include as basic substances sodium hydroxide, potassium hydroxide, trisodium phosphate, disodium phosphate, tripotassium phosphate, and dipotassium phosphate and as acidic substances sulfuric acid, persulfuric acid, phosphoric acid, hydrochloric acid, and salts thereof. The salts of metals lower than aluminum in the tendency to ionize, for examples, salts of zinc, chromium, cobalt, nickel, copper, and the like are unpreferred because of forming unnecessary films on etched surfaces. In these etching agents, it is most preferable to adjust the dissolution speed of aluminum or alloys used to from 0.3 to 40 $g/m^2$ per minute in a dipping time by the control of operating concentration and temperature. However, the dissolution speeds higher than or lower than the aforesaid range also can be allowed.

In the etching, the aluminum sheets are dipped in or coated with the aforesaid etching solutions, preferably so that the etching amount falls in the range of from 0.5 to 10 $g/m^2$. It is desirable to use aqueous solutions of bases as the etching agents because of a faster etching speed. In this case, since smut is formed, a desmutting treatment in general is carried out. Acids used for the desmutting treatment are nitric acid, sulfuric acid, phosphoric acid, chromic acid, hydrofluoric acid, borofluoric acid, and the like. The aluminum sheets having undergone the etching treatment are subjected to washing with water and the anodizing as needed. The anodizing can be carried out according to the conventional procedures in this field.

Specifically, AC or DC is allowed to pass through an aluminum sheet in an aqueous solution or non-aqueous solution containing sulfuric acid, phosphoric acid, chromic acid, oxalic acid, sulfamic acid, benzenesulfonic acid, and the like or combined acids consisting of two or more thereof to form an anodized film on the surface of the aluminum support.

Although conditions of the anodizing treatment vary depending upon the electrolytic solutions used and are difficult to determine clearly, it is suitable that in general the concentration of the electrolytic solutions ranges from 1 to 80 mass percent, the temperature thereof ranges from 5 to 70° C., the current density from 0.5 to 60 $A/dm^2$, the voltage from 1 to 100 V, and the electrolysis time from 30 sec to 50 min. Of the anodizing treatments, the method as described in British Patent 1,412,768 where a high current density is used in sulfuric acid and the method as described in U.S. Pat. No. 3,511,661 where phosphoric acid is used as an electrolytic bath are preferably adopted. The aluminum sheets having undergone the surface roughening and further the anodizing can be subjected to the hydrophilic surface-forming treatment as needed. Preferred examples of the treatment include a treatment with an alkali metal silicate, for example, an aqueous solution of sodium silicate, as disclosed in U.S. Pat. Nos. 2,714,066 and 3,181,461, a treatment with potassium fluorozirconate as disclosed in JP-B-36-22063, and a treatment with a polyvinyl phosphonic acid as disclosed in U.S. Pat. No. 4,153,461.

[Matte Layers]

It is preferable to form matte layers on the surfaces of the photosensitive layers provided as described above in order to shorten the time of evacuation in the contact exposure where a vacuum printing frame is used and to prevent a printing blur. Specifically, there are methods of forming the matte layers as described in JP-A-50-125805, JP-B-57-6582, and JP-B-61-28986 and methods of thermally fusing solid powders as described in JP-B-62-62337.

[Organic Undercoats]

In the preparation of the photosensitive lithographic printing plate precursor by use of the compositions of the invention, it is preferable to provide an organic undercoat prior to the coating of the photosensitive layer as described above in order to decrease the residual photosensitive layer of the non-image areas. Examples of organic compounds used for the organic undercoats include carboxymethyl cellulose, dextrin, gum arabic, phosphonic acids having an amino group such as 2-aminoethylphosphonic acid, organic phosphonic acids such as phenylphosphonic acid, naphthylphosphonic acid, alkylphosphonic acid, glycerophosphonic acid, methylenediphosphonic acid, and ethylenediphosphonic acid which may have a substituent group, organic phosphoric acids such as phenylphosphoric acid, naphthylphosphoric acid, alkylphosphoric acid, and glycerophosphoric acid which may have a substituent group, organic phosphinic acids such as phenylphosphinic acid, naphthylphosphinic acid, alkylphosphinic acid, and glycerophosphinic acid which may have a substituent group, amino acids such as glycine and β-alanine, hydrochlorides of amines having a hydroxyl group such as triethanolamine hydrochloride, and the like. These organic compounds can be used as mixtures thereof.

It is preferable that the organic undercoats contain compounds having an onium group. The compounds having an onium group are described in detail in JP-A-2000-10292 and JP-A-2000-108538.

Furthermore, at least one compound selected from polymeric compounds having a structural unit represented by poly (p-vinylbenzoic acid) in a molecule can be used. Specific examples of the polymeric compounds include a copolymer of p-vinylbenzoic acid and a vinylbenzyltriethylammonium salt, a copolymer of p-vinylbenzoic acid and vinylbenzyltrimethylammonium chloride, and the like.

The organic undercoats can be provided according to the following procedures. That is, the aforesaid organic compounds are dissolved in water, organic solvents such as methanol, ethanol, or methyl ethyl ketone, or mixtures thereof to prepare solutions, and an aluminum sheet is coated with the solutions and dried to provide the organic undercoat, or as another procedure, an aluminum sheet is dipped in the solutions prepared by dissolving the organic compounds in water, organic solvents such as methanol, ethanol, or methyl ethyl ketone, or mixtures thereof to allow the organic compounds to adsorb, washed with water, and then dried to provide an organic undercoat.

In the former procedure, the solution of the organic compounds having a concentration of from 0.005 to 10 mass percent can be coated by various methods. For example, all methods including bar coater coating, rotary coating, spray coating, curtain coating, and the like can be applied to the coating. In the latter procedure, the concentration of the solution is from 0.01 to 20 mass percent and preferably from 0.05 to 5 mass percent, the temperature of the dipping is from 20 to 90° C. and preferably from 25 to 50° C., and the time of the dipping is from 0.1 sec to 20 min and preferably from 2 sec to 1 min.

The solutions used herein also can be adjusted to pH 1 to 12 by use of basic substances such as ammonia, triethylamine, and potassium hydroxide, and acidic substances such as hydrochloric acid and phosphoric acid. Yellow dyes also can be added to the solutions to improve the tone reproducibility of the photosensitive lithographic printing plate precursor. Furthermore, compounds represented by the following general formula (a) also can be added to the solutions:

$$(HO)_x—R_5—(COOH)_y \quad (a)$$

wherein $R_5$ represents an arylene group having 14 or less carbon atoms, and x and y independently represent an integer of from 1 to 3.

Specific examples of the compounds represented by general formula (a) include 3-hydroxybenzoic acid, 4-hydroxybenzoic acid, salicylic acid, 1-hydroxy-2-naphthoic acid, 2-hydroxy-1-naphthoic acid, 2-hydroxy-3-naphthoic acid, 2,4-dihydroxybenzoic acid, 10-hydroxy-9-anthracene-carboxylic acid, and the like.

The amount of the coated organic undercoat after drying is suitably from 1 to 100 mg/m$^2$ and preferably from 2 to 70 mg/m$^2$. The amount less than 2 mg/m$^2$ makes it difficult to obtain sufficient press life. Exceeding 100 mg/m$^2$ also encounters the similar problem.

[Back Coats]

A back coat is provided on the back surface of the support as needed. The back coats used preferably are cover layers consisting of organic polymeric compounds as described in JP-A-5-45885 and metal oxides prepared by hydrolysis and polycondensation of organic or inorganic metal compounds as described in JP-A-6-35174. Of these cover layers, alkoxy compounds of silicon such as $Si(OCH_3)_4$, $Si(OC_2H_5)_4$, $Si(OC_3H_7)_4$, or $Si(OC_4H_9)_4$ are inexpensive and readily available, and the cover layers of metal oxides obtained therefrom are particularly preferred because of excellent resistance to the developers.

The lithographic printing plate precursors thus prepared in general are subjected to exposure through images and a development treatment. The sources of active rays used for the exposure through images are preferably those having wavelengths in the near infrared to infrared region, and solid lasers and semiconductor lasers are particularly preferred.

[Alkali Developers]

For the lithographic printing plate precursors where the infrared sensitive resin compositions of the invention are used, developers containing (a) at least one sugar selected from non-reducing sugars and (b) at least one base and having a pH falling in the range of from 9.0 to 13.5 are preferably used. The developers are hereinafter illustrated in detail. In the present specification, the developers mean development-initiating solutions (developers in a narrow sense) and replenishers unless otherwise noted.

It is preferable that the developers comprise as main ingredients at least one compound selected from the non-reducing sugars and at least one base and the pH of the developers is in the range of from 9.0 to 13.5. The non-reducing sugars are those having no free aldehyde group or ketone group and showing no reducing properties and are classified into trehalose-type oligosaccharides where reducible groups link together, glycosides where reducing groups of the sugar link with non-sugars, and sugar alcohols formed by reduction of sugars by hydrogenation. All of these non-reducing sugars can be preferably used. The trehalose-type oligosaccharides include saccharose and trehalose, and the glycosides include alkyl glycosides, phenolic glycosides, mustard oil glycosides, and the like. The sugar alcohols include D, L-arabitol, ribitol, xylitol, D, L-sorbitol, D, L-mannitol, D, L-iditol, D, L-talitol, dulcitol, allodulcitol, and the like. Furthermore, maltitol prepared by hydrogenation of disaccharides and reductants (reducing mizuame) prepared by hydrogenation of the oligosaccharides are preferably used. Of these, particularly preferred non-reducing sugars are the sugar alcohols and saccharose, and particularly D-sorbitol, saccharose, and reducing mizuame are preferred because these non-reducing sugars have the buffer action in an appropriate pH range and are available at a reduced cost.

These non-reducing sugars can be used singly or as mixtures of two or more thereof, and the content thereof in the developers is preferably from 0.1 to 30 mass percent and more preferably from 1 to 20 mass percent.

When the content does not reach this range, it is impossible to have a sufficient buffer action, and a concentration exceeding this range is difficult to reach and also encounters a problem of an increased cost. When the reducing sugars are used in combination with bases, the developers gradually change to a brown color, and the pH thereof also gradually reduces, leading to deterioration in developing power.

Alkali agents known so far can be used as the bases combined with the non-reducing sugars. Examples of the alkali agents include inorganic agents such as sodium hydroxide, potassium hydroxide, lithium hydroxide, trisodium phosphate, tripotassium phosphate, triammonium phosphate, disodium phosphate, dipotassiumphosphate, diammoniumphosphate, sodium carbonate, potassium carbonate, ammonium carbonate, sodium hydrogencarbonate, potassium hydrogencarbonate, ammonium hydrogencarbonate, sodium borate, potassium borate, and ammonium borate. Furthermore, organic alkali agents also are used, including monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and the like.

These alkali agents are used singly or as mixtures of two or more thereof. Of these agents, sodium hydroxide and potassium hydroxide are preferred. The reason for this is that pH adjustment can be carried out in a broader pH range by adjusting the amount of the agents to the non-reducing agents. Furthermore, trisodium phosphate, tripotassium phosphate, sodium carbonate, and potassium carbonate are preferred because these salts themselves have the buffer action.

These alkali agents are added to the developers so that the pH thereof falls in the range of from 9.0 to 13.5. Although the amount of the agents added is determined depending upon the desired pH and the kind and amount of the non-reducing agents used, a more preferred range of pH is from 10.0 to 13.2.

For the developers, furthermore, alkaline buffer solutions consisting of weak acids other than the sugars and strong bases can be jointly used. The weak acids used for the buffer solutions preferably have a dissociation constant (pKa) of from 10.0 to 13.2.

Such weak acids can be selected from those described in "Ionization Constants of Organic Acids in Aqueous Solution", published by Pergamon Press. Examples of the weak acids include alcohols such as 2,2,3,3-tetrafluoropropanol-1 (pKa 12.74), trifluoroethanol (pKa 12.37), and trichloroethanol (pKa 12.24), aldehydes such as pyridine-2-aldehyde (pKa 12.68), and pyridine-4-aldehyde (pKa 12.05), phenolic hydroxyl group-containing compounds such as salicylic acid (pKa 13.0), 3-hydroxy-2-naphthoic acid (pKa 12.84), catechol (pKa 12.6), gallic acid (pKa 12.4), sulfosalicylic acid (pKa 11.7), 3,4-dihydroxysulfonic acid (pKa 12.2), 3,4-dihydroxybenzoic acid (pKa 11.94), 1,2,4-trihydroxybenzene (pKa 11.82), hydroquinone (pKa 11.56), pyrogallol (pKa 11.34), o-cresol (pKa 10.33), resorcinol (pKa 11.27), p-cresol (pKa 10.27), and m-cresol (pKa 10.09), oximes such as 2-butanone oxime (pKa 12.45), acetoxime (pKa 12.42), 1,2-cycloheptanedione dioxime (pKa 12.3), 2-hydroxybenzaldehyde oxime (pKa 12.10), dimethylglyoxime (pKa 11.9), ethanediamide dioxime (pKa 11.37), and acetophenone oxime (pKa 11.35), related substances of nucleic acid such as adenosine (pKa 12.56), inosine (pKa 12.5), guanine (pKa 12.3), cytosine (pKa 12.2), hypoxanthine (pKa 12.1), and xanthine (pKa 11.9), and furthermore, diethylaminomethylphosphonic acid (pKa 12.32), 1-amino-3,3,3-trifluorobenzoic acid (pKa 12.29), isopropylidenephosphonic acid (pKa 12.10), 1,1-ethylidenediphosphonic acid (pKa 11.54), 1,1-ethylidenediphosphonic acid 1-hyroxy (pKa 11.52), benzimidazole (pKa 12.86), thiobenzamide (pKa 12.8), picolinic thioamide (pKa 12.55), and barbituric acid (pKa 12.5).

Of these weak acids, sulfosalicylic acid and salicylic acid are preferred. Preferred bases combined with these weak acids are sodium hydroxide, ammonium hydroxide, potassium hydroxide, and lithium hydroxide. These alkali agents can be used singly or as mixtures of two or more thereof. The pH is adjusted to a desired range by the concentration of the respective alkali agents and combination thereof with the weak acids.

Various surfactants and organic solvents can be added to the developers as needed for the purpose of promoting the development, dispersing a developer scum, and heightening ink receptivity of the image areas. Preferred surfactants are anionic, cationic, nonionic, and ampholytic surfactants.

Preferred examples of the surfactants include the nonionic surfactants such as polyoxyethylene alkyl ethers, polyoxyethylene alkylphenyl ethers, polyoxyethylene polystyrylphenyl ethers, polyoxyethylene polyoxypropylenealkyl ethers, glycerin fatty acid partial esters, sorbitan fatty acid partial esters, pentaerythritol fatty acid partial esters, propylene glycol fatty acid monoesters, saccharose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylene-linked castor oils, polyoxyethylene glycerin fatty acid partial esters, fatty acid diethanolamides, N,N-bis-2-hydroxyalkylamines, polyoxyethylenealkylamines, triethanolamine fatty acid esters, and trialkylamine oxides, the anionic surfactants such as fatty salts, abietic salts, hydroxyalkanesulfonic salts, alkanesulfonic salts, dialkylsulfosuccinic ester salts, straight chain alkylbenzenesulfonic salts, branched chain alkylbenzenesulfonic salts, alkylnaphthalenesufonic salts, alkylphenoxypolyoxyethylene propylsulfonic salts, polyoxyethylene alkylsulfophenyl ether salts, N-methyl-N-oleyltaurine sodium salt, N-alkylsulfosuccinic monoamide disodium salt, petroleum sulfonic salts, sulfated tallow oil, sulfuric ester salts of fatty alkyl esters, sulfuric alkyl ester salts, polyoxyethylene alkyl ether sulfuric ester salts, fatty monoglyceride sulfuric ester salts, polyoxyethylene alkylphenyl ether sulfuric ester salts, polyoxyethylene styrylphenyl ether sulfuric ester salts, alkyl phosphoric ester salts, polyoxyethylene alkyl ether phosphoric ester salts, polyoxyethylene alkylphenyl ether phosphoric ester salts, partially saponified products of styrene/maleic anhydride copolymers, partially saponified products of olefin/maleic anhydride copolymers, and formalin-condensed naphthalenesulfonic salts, the cationic surfactants such as alkylamine salts, quaternary ammonium salts such as tetrabutylammonium bromide, polyoxyethylene alkylamine salts, and polyethylene polyamine derivatives, and the ampholytic surfactants such as carboxybetaines, amino carboxylic acids, sulfobetaines, amino sulfuric esters, and imidazolines.

The polyoxyethylene as described above as to the surfactants means polyoxyalkylene such as polyoxymethylene, polyoxypropylene, or polyoxybutylene. The names of such surfactants also should be read in such a way.

Further preferred surfactants are fluorine-series surfactants containing a perfluoroalkyl group in molecule. Examples of the fluorine-series surfactants include anionic type surfactants such as perfluoroalkylcarboxylic salts, perfluoroalkylsufonic salts, and perfluoroalkylphosphoric salts, ampholytic type surfactants such as perfluoroalkylbetaines, cationic type surfactants such as perfluoroalkyltrimethylammonium salts, and nonionic type surfactants such as perfluoroalkylamine oxides, perfluoroalkylethylene oxide adducts, oligomers containing perfluoroalkyl groups and hydrophilic groups, oligomers containing perfluoroalkyl groups and lipophilic groups, oligomers containing perfluoroalkyl groups, hydrophilic groups, and lipophilic groups, and urethanes containing perfluoroalkyl groups and lipophilic groups.

The aforesaid surfactants can be used singly or as mixtures of two or more thereof and added to the developers preferably in an amount ranging from 0.001 to 10 mass percent and more preferably from 0.01 to 5 mass percent.

A variety of development stabilizers can be used for the developers. Preferred examples of the stabilizers include polyethylene glycol adducts of sugar alcohols as described in JP-A-6-282079, tetraalkylammonium compounds such as tetrabutylammonium hydroxide, phosphonium salts such as tetrabutylphosphonium bromide, and iodonium salts such as diphenyliodonium chloride. Furthermore, the examples include anionic and ampholytic surfactants as described in JP-A-50-51324, water-soluble cationic polymers as described in JP-A-55-95946, and water-soluble ampholytic polymeric electrolytes as described in JP-A-56-142528.

Furthermore, the examples include organic boron compounds to which alkylene glycols are added as described in JP-A-59-84241, polyoxyethylene/polyoxypropylene block polymerization type water-soluble surfactants as described in JP-A-60-111246, alkylenediamine compounds having polyoxyethylene/polypropylene substituted as described in JP-A-60-129750, polyethylene glycol having a weight average molecular weight of 300 or more as described in JP-A-61-215554, fluorine-containing surfactants having a cationic group as described in JP-A-63-175858, water-soluble ethylene oxide adduct compounds prepared by adding four or more moles of ethylene oxide to acid or alcohol as described in JP-A-2-39157, water-soluble polyalkylene compounds, and the like.

Furthermore, organic solvents can be added to the developers as needed. Solvents having a water solubility of about 10 mass percent or less, preferably 5 mass percent or less, are selected as the organic solvents. Examples of such solvents include 1-phenylethanol, 2-phenylethanol, 3-phenyl-1-propanol, 4-phenyl-1-butanol, 4-phenyl-2-butanol, 2-phenyl-1-butanol, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 3-methyl- and 4-methylcyclohexanol, N-phenylethanolamine, N-phenyldiethanolamine, and the like.

The content of the organic solvents in the total mass of the developers in use are from 0.1 to 5 mass percent. The content is in close contact with the content of the surfactants. That is, it is preferable that as the content of the organic solvents is increased, that of the surfactants also is increased. The reason for this is that the organic solvents fail to dissolve completely when a smaller content of the surfactants and a larger content of the organic solvents are used, thereby to make it difficult to ensure satisfactory development performance.

Moreover, reducing agents can be added to the developers to prevent the printing formes from scuming. Preferred organic reducing agents include phenolic compounds such as thiosalicylic acid, hydroquinone, Metol, methoxyquinone, resorcin, and 2-methylresorcin and amine compounds such as phenylenediamine and phenylhydrazine. Further preferred inorganic reducing agents include sodium salts, potassium salts, and ammonium salts of sulfurous acid, sulfurous hydrogen acid, phosphorous acid, phosphorous hydrogen acid, phosphorous dihydrogen acid, thiosulfuric acid, dithionic acid, and the like.

Of these reducing agents, those having a particularly excellent effect on the prevention of scumming are sulfurous salts. The content of these reducing agents in the developers in use is in the range of from 0.05 to 5 mass percent.

Organic carboxylic acids also can be further added to the developers. Preferred carboxylic acids are aliphatic carboxylic acids having six to 20 carbon atoms and aromatic carboxylic acids. Specific examples of the aliphatic carboxylic acids include caproic acid, enanthylic acid, capric acid, lauric acid, myristic acid, palmitic acid, stearic acid, and the like, and particularly preferred ones are alkanoic acids having eight to 12 carbon atoms. Unsaturated aliphatic acids having a double bond in a carbon chain and aliphatic acids having a branched chain also can be used. The aromatic carboxylic acids are compounds having a carboxylic group substituted on a benzene ring, a naphthalene ring, an anthracene ring, and the like, and specific examples thereof include o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid, 2-naphthoic acid, and the like. The hydroxynaphthoic acids are particularly effective.

It is preferable to use the aforesaid aliphatic and aromatic carboxylic acids as sodium salts, potassium salts, or ammonium salts in order to increase the solubility in water. Although the content of the organic carboxylic acids in the developers of the invention is not particularly limited, the content less than 0.1 mass percent fails to exert a sufficient effect and exceeding 10 mass percent not only can expect more improvement in the effect, but disturbs sometimes the dissolution of other additives used together. Therefore, the content of the acids in the developers in use is from 0.1 to 10 mass percent and more preferably from 0.5 to 4 mass percent.

The developers can further contain as needed antiseptic agents, colorants, thickeners, anti-foaming agents, water softeners, and the like. Examples of the water softeners include polyphosphoric acid, and the sodium salts, potassium salts, and ammonium salts thereof; aminopolycarboxylic acids such as ethylenediaminetetraacetic acid, diethylene-triaminepentaacetic acid, triethylenetetraminehexaacetic acid, hydroxyethylethylenediaminetriacetic acid, nitrilotriacetic acid, 1,2-diaminocyclohexanetetraacetic acid, and 1,3-diamino-2-propanoltetraacetic acid, and the sodium salts, potassium salts, and ammonium salts thereof, and aminotri(methylenephosphonic acid), ethylenediaminetetra-(methylenephosphonic acid), diethylenetriaminepenta-(methylenephosphonic acid), triethylenetetraminehexa-(methylenephosphonic acid), hydroxydiethylethylenediamine-tri (methylenephosphonic acid), 1-hydroxyethane-1,1-disulfonic acid, and the sodium salts, potassium salts, and ammonium salts thereof.

Although the most suitable content of these water softeners varies depending upon chelation and the hardness and amount of water, the content thereof in the developers in use in general is in the range of from 0.01 to 5 mass percent and more preferably from 0.01 to 0.5 mass percent. The content not reaching this range fails to attain fully the desired end, and exceeding this range exerts a bad effect on the image areas in color discharge. A residual ingredient of the developers is water. It is profitable for the transportation of the developers to prepare the concentrated solutions thereof where the amount of water is decreased as compared with the developers in use and to dilute the concentrated solutions with water prior to the use of the developers. It is appropriate in this case to concentrate the developers to an extent that ingredients contained therein are not separated or deposited.

To the developers of the lithographic printing plate precursors containing the infrared sensitive compositions of the invention, it is possible to add further silicate compounds as the compounds exerting the buffer action in a suitable pH range in place of the aforesaid reducing sugars. Specifically, mixtures of silicon oxide $SiO_2$ as a silicate component and an alkali oxide $M_2O$ (M represents an alkali metal) as an alkali component can be added. The ratio of $SiO_2$ to $M_2O$ can be easily controlled in the most suitable range by the adjustment of the concentrations. These silicate salts act as hydrophilic ingredients for bases.

The molar ratio of silicon oxide to an alkali oxide ($SiO_2/M_2O$) is preferably in the range of from 0.75 to 4.0, more preferably from 0.75 to 3.0, and further preferably from 0.75 to 1.5.

The ratio less than 0.75 allows excessive dissolution (etching) of the anodized film on the aluminum base because of strong alkalinity to cause the aforesaid scum by allowing to stand or insoluble dregs by forming the complex between the dissolved aluminum and silicic acid. Exceeding 4.0 or furthermore 3.0 encounters problems of allowing the developing power to decrease and causing insoluble dregs of condensed silicates in some cases.

The concentration of the alkali silicates in the developers falls preferably in the range of from 0.5 to 10 mass percent and more preferably from 3 to 8 mass percent to the mass of the aqueous alkali solution. The concentration less than 0.5 mass percent results in deteriorating the development performance and the capacity of development treatment in some cases. Exceeding 10 mass percent tends to cause precipitates or crystals to form or to allow waste liquid to gel on neutralizing it, encountering a problem of waste disposal.

Furthermore, a variety of the aforesaid surfactants and organic solvents can be added to the developers as needed in order to promote the development, disperse the development dregs, and heighten the ink receptivity of the image areas on the printing forme.

The lithographic printing plate precursors (Hereinafter referred to as "PS plates") having developed with the developers having these compositions are subjected to post-treatments with washing water, rinsings containing the surfactants, and finishers or protective gum liquids containing gum arabic or starch derivatives as principle ingredients. In the invention, it is possible to carry out the post-treatments of the PS plates by various combinations of the aforesaid treatments.

In recent years automatic processors for the PS plates have been widely used for rationalization and standardization of platemaking operations in the printing industries. The automatic processors in general consist of a developing part and a post-treatment part and have a unit for conveying the PS plate, respective tanks for treatment solutions and units for spraying wherein the development treatment and post-treatments are carried out by spraying through nozzles the respective treatment solutions pumped up while conveying the PS plate horizontally. Furthermore, a method of performing the development treatment while dipping and conveying the PS plate into treatment solutions filled in tanks with the aid of guide rolls and a method of recycling waste water as a diluent for the stock solution of the developer, waste water which has been supplied onto a plate surface as a small constant amount of washing water after development and used to wash the plate surface also are known recently.

These automatic treatments can be carried out while supplying the respective replenishers to the treatment solutions depending upon the amounts and operating times of treatment. Furthermore, the throwaway systems also can be applied in which the treatments were carried out by use of substantially virgin treatment solutions. The lithographic printing plates prepared by these treatments are set on offset presses and used for producing a great number of printed sheets.

EXAMPLES

The invention is hereinafter illustrated through examples. The invention is not to be construed as limited by these examples.

[Preparation of Support]

The surface of an aluminum sheet JIS A 1050 was subjected to sand dressing by use of an aqueous pumice suspension as an abrasive with the aid of a rotary nylon brush. The surface roughness (center line average roughness) was 0.5 μm. After washing with water, the sheet was dipped in a 10 percent aqueous solution of sodium hydroxide maintained at 70° C. and etched so that the amount of aluminum dissolved became 6 $g/m^3$. After washing with water, the sheet was dipped in 30 percent nitric acid for 1 min to be neutralized, and sufficiently washed with water. Thereafter, the electrolytic surface roughening of the sheet was carried out in 0.7 percent nitric acid for 20 sec by use of a rectangular wave alternating waveform voltage of an anode voltage of 13 V and a cathode voltage of 6 V, the sheet was dipped in 20 percent sulfuric acid of 50° C. to wash the surface, and then washed with water.

The aluminum sheet after the surface roughening was subjected to a porous anodizing film-forming treatment in 20 percent sulfuric acid by use of a direct current. The electrolysis was carried out in a current density of 5 $A/dm^2$ to prepare a base having an anodized film of 4.0 $g/m^2$ in mass on the surface by controlling the electrolysis time. The resulting base was treated in a saturated steam chamber at 100° C. and 1 atm for 10 sec to prepare base (a) having a sealing ratio of 60 percent.

After base (a) underwent the hydrophilic surface-forming treatment in 2.5 mass percent aqueous solution of sodium silicate at 30° C. for 10 sec, the base was coated with the following undercoating, and dried at 80° C. for 15 sec to prepare support [A] for the lithographic printing plate precursor. The amount of the coated film was 15 $mg/m^2$ after drying.

| [Undercoating] | |
|---|---|
| Copolymer (1) as described below | 0.3 g |
| Methanol | 100 g |
| Water | 1 g |

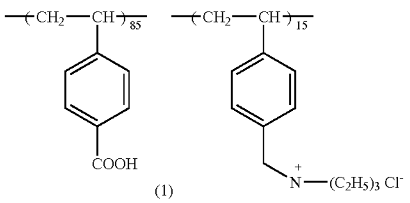

(1)

Weight Average Molecular Weight 26,000

[Formation of Heat-Sensitive Layer]

The aluminum support [A] having undergone the undercoat treatment as prepared above and a flat SUS base for measuring a solution velocity were coated with the following photosensitive solution so as to become 1.5 $g/m^2$ in coat amount, and dried to form photosensitive layers (recording layers), thus original formes 1 for the heat-sensitive lithographic printing plate precursor of the invention (treated aluminum base) and 2 (SUS base) having been obtained. The leucohydroxy dyes of the invention represented by general formula (I) and used for the photosensitive solutions are shown in Table 1.

| [Photosensitive Solution] | |
|---|---|
| Phenol/m-cresol/p-cresol (25/50/25 in molar ratio)-Formaldehyde Novolak Resin (Weight average molecular weight: 4,500) | 1.0 g |
| Cyanine Dye A (Having the following structure) | 0.06 g |
| Leucohydroxy Dye Represented by Formula (I) of the Invention | 0.06 g |
| Phthalic Anhydride | 0.03 g |
| 3-Methoxy-4-diazodiphenylaminehexafluorophosphate | 0.015 g |
| Fulorine-series Polymer (Megafack F-176, Solid Content: 20 percent, Manufactured by Dainippon Ink and Chemicals, Inc.) | 0.015 g |
| Fluorine-series Polymer (Megafack MCF-312, Solid Content: 30 percent, Manufactured by Dainippon Ink and Chemicals, Inc.) | 0.035 g |
| Methyl Ethyl Ketone | 8 g |
| 1-Methoxy-2-propanol | 4 g |

-continued

[Photosensitive Solution]

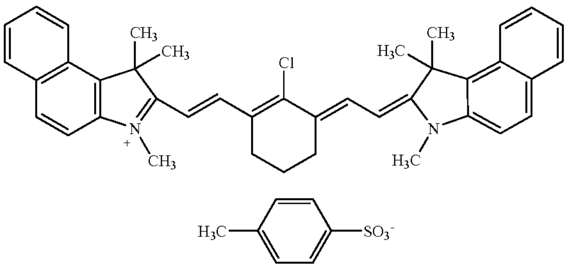

Cyanine Dye A

[Formation of Heat-sensitive Layers in Comparative Examples]

The aluminum supports [A] having undergone the undercoat treatment were coated with photosensitive solutions of comparative examples where 0.06 g of the following leuco dye B or 0.06 g of Crystal Violet was added in place of the leucohydroxy dyes represented by general formula (I) of the invention and dried to obtain a coat amount of 1.5 $g/m^2$, thus heat-sensitive lithographic printing plate precursors of Comparative Examples 1 and 2 having been obtained.

Leuco Dye B

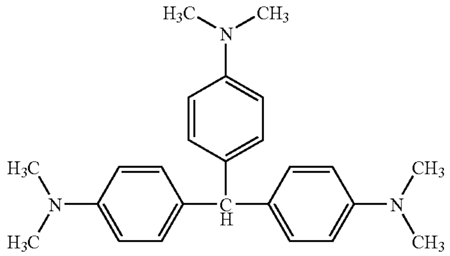

Crystal Violet

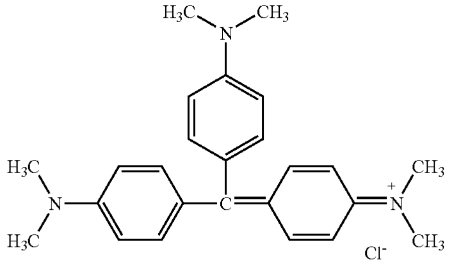

[Preparation of Developers]

(Developer A)

The respective ingredients were adjusted as follows and mixed to prepare developer A. That is, D-sorbitol 0.22 mole/l, potassium hydroxide 0.22 mole/l, and potassium citrate 18 g/l. The electric conductivity of this developer was about 45 mS/cm.

(Developer B)

Developer B was prepared from 4 weight percent of potassium silicate where the ratio of silicon oxide ($SO_2$) to potassium oxide ($K_2O$) ($SO_2/K_2O$) was 1.1, 0.5 weight percent of citric acid, and 0.5 weight percent of polyethylene glycol lauryl ether. The electric conductivity of this developer was about 47 mS/cm.

Examples 1 to 6 and Comparative Examples 1 and 2

Evaluation of Dissolution Discrimination in Development

Original formes 2 (SUS base) as prepared above were exposed to energy of 200 mJ/cm$^2$ at the conditions of a beam strength of 9 W and a drum-rotational speed of 150 rpm on a Trendsetter 3244 produced by Creo Inc. Times taken to completely dissolute and remove the exposed portions and the unexposed portions were measured as to alkali developers A and B having the above compositions on a solution velocity monitor (DRM produced by The Perkin-Elmer Corporation). Results are shown in Table 1.

TABLE 1

| | Developer | Compound Represented by Formula (I) | Dissolution Time of Unexposed Portions (sec) | Dissolution Time of Exposed Portions (sec) | Dissolution Discrimination (Ratio of Dissolution Time) |
|---|---|---|---|---|---|
| Example 1 | Developer A | I-4 | 102 | 2.2 | 46.4 |
| Example 2 | Developer A | I-6 | 108 | 2.5 | 43.2 |
| Example 3 | Developer A | I-8 | 114 | 2.8 | 40.7 |
| Example 4 | Developer A | I-14 | 92 | 2.1 | 43.8 |
| Example 5 | Developer B | I-8 | 109 | 2.6 | 41.9 |
| Example 6 | Developer B | I-15 | 120 | 3.0 | 40.0 |
| Comparative Example 1 | Developer A | Leuco Dye B | 35 | 2.6 | 13.5 |
| Comparative Example 2 | Developer A | Crystal Violet | 116 | 8.0 | 14.5 |

Table 1 reveals that use of the composition of the invention exerts no effect on the solubility of the unexposed portions but promotes the solubility of the exposed portions. That is, an increase in the ratio of the solution velocities (ratio of dissolution time) between the unexposed portions and exposed portions shows improvement in the dissolution discrimination.

Examples 7 to 10 and Comparative Examples 3 and 4

Similarly to Examples 1 to 4, the photosensitive layers of Examples 7 to 10 were formed as shown in Table 2.

[Evaluation of Latitude in Development]

The resulting lithographic printing plate precursors 1 and the original formes of Comparative Examples 1 and 2 underwent image-like drawing of a test pattern on a Trendsetter 3244 produced by Creo Inc. at a beam strength of 9 W and a drum-rotational speed of 150 rpm.

The lithographic printing plate precursors exposed under the conditions as described above were developed at a developer temperature of 30° C. for a development time of 12 sec in a PS processor 900H produced by Fuji Photo Film Co., Ltd. which contained a 1.5-fold concentrated solution of the aforesaid developer A.

Subsequently, the developer was stepwise diluted with water to repeat the treatment. Then, the presence or absence of scum stemming from residual films of the recording layers owing to inferior development and the reduction in density of the image areas were checked. Furthermore, the treatment was repeated while diluting the developer with water, and the electric conductivity of the developers which were able to develop without causing trouble was measured. A developer having a larger difference between the highest value and lowest value was recognized as excellent in the latitude in development.

[Evaluation of Sensitivity]

The lithographic printing plate precursors 1 and the original formes of Comparative Examples 1 and 2 as prepared above were exposed to various exposing energies through a 200 lines, 3 to 97 percent dot image in a Trendsetter 3244 produced by Creo Ink. and developed with developer A at a developer temperature of 30° C. for 12 sec. The sensitivity was assumed to be an exposing energy that reproduces the 3 percent dot image. The smaller exposing energy denotes that the original forme has a higher sensitivity.

Results are shown in Table 2.

TABLE 2

| | Compound Represented by Formula (I) | Latitude in Development (mS/cm) Highest Value | Lowest Value | Difference | Sensitivity (mJ/cm$^2$) |
|---|---|---|---|---|---|
| Example 7 | I-4 | 52 | 40 | 12 | 140 |
| Example 8 | I-6 | 53 | 42 | 11 | 150 |
| Example 9 | I-8 | 53 | 43 | 10 | 150 |
| Example 10 | I-14 | 50 | 39 | 11 | 130 |
| Comparative Example 3 | Leuco Dye B | 43 | 39 | 4 | 180 |
| Comparative Example 4 | Chrystal Violet | 55 | 49 | 6 | 240 |

Results of Table 2 reveal that the application of the infrared sensitive compositions of the invention to the image-forming layers of the lithographic printing plate precursors makes possible an excellent latitude in development and a high sensitivity.

The infrared sensitive compositions having an excellent latitude in development and a high sensitivity can be provided when the compositions are used for the image-forming layers of the lithographic printing plate precursors.

This application is based on Japanese patent application JP2002-285697, filed on Sep. 30, 2002, the entire content of which is hereby incorporated by reference, the same as if set forth at length.

What is claimed is:

1. An infrared sensitive composition comprising:

(A) an alkali-soluble resin having a phenolic hydroxyl group;

(B) a light-heat converting substance; and (C) a leucohydroxy dye represented by the following general formula (I):

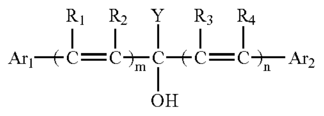

(I)

wherein $Ar_1$ and $Ar_2$ each may be the same or different and represent an aryl group or a heteroaryl group, which may have a substituent group; $R_1$ to $R_4$ each may be the same or different and represent a hydrogen atom or an alkyl group which may have a substituent; Y represents a hydrogen atom, or an alkyl, aryl or heteroaryl groups which may have a substituent; when at least one of $Ar_1$ and $Ar_2$, or Y is an aryl group, at least one of $Ar_1$, $Ar_2$ and Y has as a substituent a hydroxy group, an amino group, a monoalkylamino group or a dialkylamino group at the ortho or para position; two of $Ar_1$, $Ar_2$ and Y may link together through a connecting group to form a ring; and m and n each represent 0 or 1.

2. The infrared sensitive composition as described in claim 1, which comprises the alkali-soluble resin (A) in an amount of from 30 to 99 weight percent.

3. The infrared sensitive composition as described in claim 1, which comprises the light-heat converting substance (B) in an amount of from 0.01 to 50 weight percent.

4. The infrared sensitive composition as described in claim 1, which comprises the leucohydroxy dye (C) in an amount of from 0.01 to 15 weight percent.

5. A lithographic printing plate precursor comprising a support and an image-forming layer, wherein the image-forming layer comprises:

(A) an alkali-soluble resin having a phenolic hydroxyl group;

(B) a light-heat converting substance; and (C) a leucohydroxy dye represented by the following general formula (I):

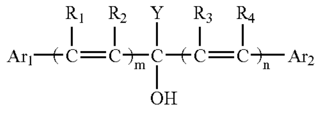

(I)

wherein $Ar_1$ and $Ar_2$ each may be the same or different and represent an aryl group or a heteroaryl group, which may have a substituent group; $R_1$ to $R_4$ each may be the same or different and represent a hydrogen atom or an alkyl group which may have a substituent; Y represents a hydrogen atom, or an alkyl, aryl or heteroaryl groups which may have a substituent; when at least one of $Ar_1$ and $Ar_2$, or Y is an aryl group, at least one of $Ar_1$, $Ar_2$ and Y has as a substituent a hydroxy group, an amino group, a monoalkylamino group or a dialkylamino group at the ortho or para position; two of $Ar_1$, $Ar_2$ and Y may link together through a connecting group to form a ring; and m and n each represent 0 or 1.

6. The lithographic printing plate precursor as described in claim 5, wherein the image-forming layer comprises the alkali-soluble resin (A) in an amount of from 30 to 99 weight percent.

7. The lithographic printing plate precursor as described in claim 5, wherein the image-forming layer comprises the light-heat converting substance (B) in an amount of from 0.01 to 50 weight percent.

8. The lithographic printing plate precursor as described in claim 5, wherein the image-forming layer comprises the leucohydroxy dye (C) in an amount of from 0.01 to 15 weight percent.

* * * * *